(12) United States Patent
Farhang-Boroujeny

(10) Patent No.: US 6,798,754 B1
(45) Date of Patent: Sep. 28, 2004

(54) ACOUSTIC ECHO CANCELLATION EQUIPPED WITH HOWLING SUPPRESSOR AND DOUBLE-TALK DETECTOR

(75) Inventor: Behrouz Farhang-Boroujeny, Singapore (SG)

(73) Assignee: National University of Singapore, Crescent (SG)

( * ) Notice: Subject to any disclaimer, the term of this patent is extended or adjusted under 35 U.S.C. 154(b) by 0 days.

(21) Appl. No.: 09/554,244

(22) PCT Filed: Nov. 12, 1998

(86) PCT No.: PCT/SG98/00091

§ 371 (c)(1),
(2), (4) Date: Jul. 10, 2000

(87) PCT Pub. No.: WO99/26355

PCT Pub. Date: May 27, 1999

(30) Foreign Application Priority Data

Nov. 13, 1997 (SG) .......................................... 9704040-6

(51) Int. Cl.[7] ................................................ H04B 3/20

(52) U.S. Cl. ...................................................... 370/286

(58) Field of Search ...................... 379/406.01, 406.16, 379/417, 416, 402; 370/286, 287, 288, 289, 290, 291, 465, 311, 314, 276, 277, 280, 281, 282, 294, 293, 295, 296, 480, 201, 307; 455/570

(56) References Cited

U.S. PATENT DOCUMENTS 4,894,820 A   1/1990   Miyamoto et al. ........... 370/290
4,951,269 A   8/1990   Amano ........................ 367/135

(List continued on next page.)

OTHER PUBLICATIONS

C.H. Yon and C.K. Un, 1994 IEEE, Fast Multidelay Block Transform–Domain Adaptive Filters Based on a 2–dimentional Optimum Block Algorithm.*
Mohammad Rea Asharif, Tomoyoshi Takebayashi, 1996 IEEE, Frequency Domain Noise Canceller: Frequency Bin Adaptive Filtering (FBAF).*

(List continued on next page.)

Primary Examiner—Dang Ton
(74) Attorney, Agent, or Firm—Birch, Stewart, Kolasch & Birch, LLP

(57) ABSTRACT

An acoustic echo canceller (AEC) is devised and tested in a real environment. The devised AEC puts together a number of available digital signal processing methods to make a real-time implementation of the AEC possible. The echo length coverage of the devised AEC can be as large as several hundred milliseconds. The devised AEC is based on a frequency domain implementation of the least-mean square (LMS) determination method. The fast Fourier transforms required for the implementation have been carefully selected and optimized so that a realtime implementation of the AEC is possible. In addition, two novel techniques are invented and added to the AEC to overcome two annoying serious problems commonly encountered in AEC systems. The first technique is a special howling suppressor which can successfully prevent the oscillation of the AEC under all possible practical conditions. The second proposed technique is a very simple, but yet very effective, double-talk detector. The double-talk detector is used to control the step-size of the AEC adaptation mechanism. To demonstrate a preferred embodiment of the invention, the AEC is programmed in C-language for running on personal computers. At a sampling frequency of 8 kHz, and for an echo coverage of 200 milliseconds the developed AEC program takes-up only about 40% of the CPU time of a Pentium 166 MHz processor. The proposed AEC can also be executed on other platforms.

20 Claims, 6 Drawing Sheets

U.S. PATENT DOCUMENTS

| | | | | | |
|---|---|---|---|---|---|
| 5,390,250 | A | * | 2/1995 | Janse et al. | 379/406.08 |
| 5,463,618 | A | | 10/1995 | Furkawa et al. | 370/290 |
| 5,524,149 | A | * | 6/1996 | Frenzel | 379/379 |
| 5,526,426 | A | | 6/1996 | McLaughlin | 379/406.13 |
| 5,535,194 | A | | 7/1996 | Ashley et al. | 370/289 |
| 5,825,754 | A | * | 10/1998 | Williams | 370/290 |
| 5,848,151 | A | * | 12/1998 | Boudy et al. | 379/406.13 |
| 5,959,965 | A | * | 9/1999 | Ohkubo et al. | 370/203 |
| 6,496,581 | B1 | * | 12/2002 | Finn et al. | 379/406.01 |

OTHER PUBLICATIONS

Ferrara, IEEE, vol. 28, No. 4, pp. 474–475 (1980).
Clark et al., IEEE, vol. 31, No. 5, pp. 1073–83 (1983).
Asharif et al., IEEE, vol. 42, No. 12, pp. 3090–94 (1994).
Soo et al., IEEE, vol. 38, No. 2, pp. 373–376 (1990).
Farhang–Boroujeny, IEEE, vol. 44, No. 11, pp. 2865–68 (1996).

* cited by examiner

ACOUSTIC ECHO CANCELLATION EQUIPPED WITH HOWLING SUPPRESSOR AND DOUBLE-TALK DETECTOR

This application is the national phase under 35 U.S.C. § 371 of PCT International Application No. PCT/SG98/00091 which has an International filing date of Nov. 12, 1998, which designated the United States of America.

FIELD OF THE INVENTION

The invention relates to acoustic echo cancellation as applied to full-duplex speakerphones and teleconferencing systems.

BACKGROUND OF THE INVENTION

To date, most of the speakerphones operate based on a half-duplex mode, i.e., at any given time the speech of one of the two parties at the two sides of the telephone line (i.e., the near-end and the far-end) can pass through to the other side. A detector on the telephone set senses the in-coming and out-going sounds and activates the line in one of the two possible directions. This arrangement creates an annoying chopping of the speech signals when the near-end and far-end parties talk at the same time. This problem is more serious if a similar technique is adopted for a teleconferencing system.

Full-duplex operation of speakerphones and teleconferencing systems can be realized by using adaptive filtering techniques. An adaptive filter is used to model the acoustics of the room and obtain a replica of the acoustical signal echoes which are coming from the loudspeaker and picked-up by the microphone.

The acoustical echoes generated in a normal size office room usually span over a couple of hundreds of milliseconds, and increases to several hundred milliseconds in larger size rooms. This demands the use of adaptive filters with a few thousand taps to get an accurate model of the room acoustics. Thus, the problem of acoustic echo cancellation is in the realization of very long adaptive filters.

Such adaptive filters are computationally very demanding in a real-time environment. It has been noted that this a problem is overcome by block processing of the signal samples in the frequency domain. See generally, Ferrara, E. R., "Fast implementation of EMS adaptive filters", *IEEE Trans. Acoust., Speech, and Signal Processing*, vol. ASSP-28, pp. 474–475, August 1980, and Clark, G. A., S. R. Parker, and S. K. Mitra, "A unified approach to time and frequency domain realization of FIR adaptive digital filters", *IEEE Trans. on Acoustic, Speech and Signal Processing*, vol. ASSP-31, pp. 1073–1083, 1983. However, the frequency domain implementation of adaptive filters as originally proposed in the cited papers introduces some excessive delay at the filter output which becomes unacceptable as filter length increases. This problem has been resolved by introducing some partitioning on the convolution sum of the original filter and rearranging the sum as an aggregate of smaller convolutions. See generally, Asharif, M. R., and F. Amano, "Acoustic echo-canceller using the FBAF algorithm", *IEEE Transactions on Communications*, vol. COM-42, pp. 3090–3094, 1994, Soo, J. S., and K. K. Pang, "Multidelay block frequency domain adaptive filter", *IEEE Trans. Acoust. Speech and Signal Process.*, vol. ASSP-38, pp. 373–376, 1990, and McLaughlin, "system and methods for an efficiently constrained frequency-domain adaptive filter", U.S. Pat. No. 5,526,426 (June 1996).

Although these reports suggest a solution to reduce the delay of the frequency domain adaptive filters, they create another problem. The resulting structure converges very slowly. The source of this problem has been identified by the inventor of the present invention—see Farhang-Boroujeny, B., "Analysis and efficient implementation of partitioned block LMS adaptive filters". *IEEE Trans. Signal Processing*, vol. 44, pp. 2865–2868, November 1996, herein incorporated by reference in its entirety, where it is suggested that the block length has to be shorter than the partition length.

In addition to the modelling of room acoustics, there are two more problems which have to be considered and solved for successful implementation of AEC systems.

The first problem is suppression of possible howling of the system that arises due to a positive feedback which may build up in a loop that includes a loudspeaker, microphone and hybrid circuit of a telephone line. This feedback causes an oscillation in the system and makes a very loud and annoying noise which disrupts the communication. To date, most of the acoustic echo cancelling systems assume that howling is suppressed once the acoustical echo of the room is modelled by the AEC adaptive filter. Although true in theory, this assumption is not completely correct in practice. The problem is that the howling may start once the room acoustics are changed due to some movements in the room and the intensity of the howling grows very fast. It is usually difficult for the adaptive filter of the AEC to quickly react and adapt before the system goes to an uncontrollable state. To resolve this problem, this invention suggests a simple and fast mechanism that can immediately stop the howling. This mechanism fits very nicely as an integral part of the proposed frequency domain implementation of the AEC.

The second problem is double-talk. The error signal in the AEC set-up is the transmit signal. This transmit signal is used to adapt the coefficients of the AEC to its environment. When there is no near-end (or local) speech (or any other sound) and the AEC coefficients approach their optimum values, the transmit signal approaches zero. This assures a small perturbation of the AEC coefficients around their optimal values after their adaptation. However, this does not remain the case when there is some near-end speech. The near-end speech results in a large transmit (error) signal. This, in turn, affects the setting of the AEC coefficients, as the transmit signal through the adaptive mechanism greatly disturbs the AEC coefficients. This results in an enhancement of the uncancelled echoes.

To resolve this problem, one should detect the state of double-talk in the AEC and take an appropriate action to minimize the disturbance of the AEC coefficients during double-talk periods. Most of the available echo-cancelling systems simply freeze the adaptation process, once a double-talk state is recognized. See generally, Ashley et al., "Method and apparatus for echo cancelling with double-talk immunity", U.S. Pat. No. 5,535,194 (July 1996), Miyamoto et al, "Double-talk detection in an echo canceller", U.S. Pat. No. 4,894,820 (January 1990), and Furukawa et al, "Echo canceller", U.S. Pat. No. 5,463,618 (October 1995). This strategy works well only when there is no significant variation of the echo-path during the double-talk period and, thus, no adaptation of the AEC coefficients is required. In practice this is not necessarily the case. There is always some chance of variation of the echo path at any moment of time, including during the double-talk period. Freezing the AEC coefficients during double-talk is not appropriate. A better compromise solution is to continue adaptation during double-talk period, but use a smaller compromised step-size as discussed below. In this invention we propose a simple mechanism for detecting double-talk periods and controlling the step-size of the adaptation mechanism of the AEC during these periods.

SUMMARY OF THE INVENTION

In this invention we have developed a real-time software solution to the problem of acoustic echo cancellation. This solution combines a number of signal processing techniques to come-up with an efficient echo cancellation system. To demonstrate the efficiency of the proposed system, a program which can run in realtime on Pentium personal computers has been developed and tested. The proposed solution is based on a frequency domain adaptive filtering technique.

The invention gives a very effective solution to the problem of howling. The proposed solution takes advantage of the available frequency bins in the proposed frequency domain implementation and suggests an effective way of introducing a null at the frequency that howling occurs. This solution is not limited to the developed software. It can be used in other implementations of echo cancelling systems, as well.

The invention also gives a solution to the double-talk problem. A simple mechanism for detecting double-talk states is proposed. Furthermore, a method for controlling the step-size of the adaptation mechanism which results in a good compromise solution is devised. The proposed solution was experimentally tested and found to be very effective in real-world environments. This solution also is not limited to the developed software. It can be used in other implementations of echo cancelling systems as well.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE INVENTION

Figure 1:
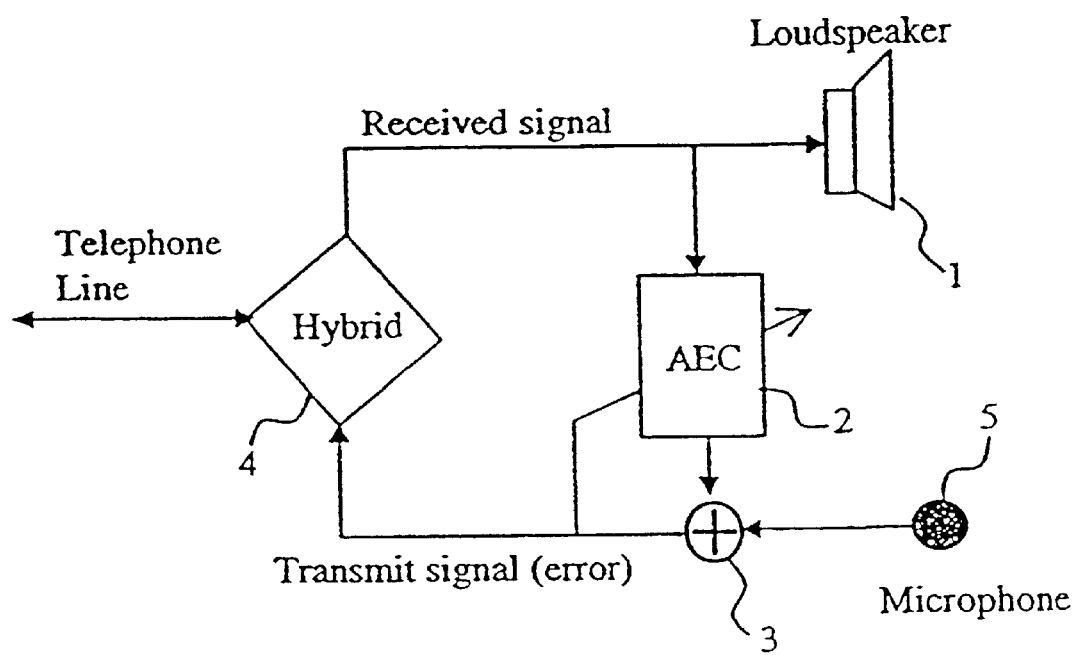
FIG. 1 shows an acoustic echo canceller set-up.

The exemplary embodiments of the invention claimed in the appended claims may be more fully appreciated by reference to the following description of preferred embodiments. Within the drawing figures, it should be understood that like elements are identified by like reference numbers.

FIG. 1 shows a general acoustic echo cancellation set-up in the context of teleconferencing and hand-free telephone systems. The signal received from a telephone line passes through a hybrid circuit 4 and is broadcast through a loudspeaker 1 in a local room where it can be heard by anybody in the room. A microphone 5 located in the room is used to pick-up any sound activities in the room and send them through the telephone line to a remote site. This arrangement clearly results in a feedback of echo of the speech of the remote site party to himself or herself, as the microphone 5 cannot differentiate the sound coming from the loudspeaker 1 from other sound activities in the local room.

To prevent this annoying echo, an adaptive filter 2 is used to model the acoustics of the room and obtain a replica of the acoustical signal echoes which are coming from the loudspeaker 1 and picked-up by the microphone 5. The acoustical echoes generated in a normal room usually span over a few hundred milliseconds. This, in turn, demands the use of an adaptive filter with a few thousand taps to get a good model of the room acoustics. For instance, if the speech signals are sampled at the rate of 8 kilo-samples/s, an acoustical echo of duration 200 milliseconds will translate to 8000*0.2=1600 samples. For this example an adaptive filter with at least 1600 taps is required to achieve a complete modelling of the room acoustics. Thus, the problem of acoustic echo cancellation is that of the realization of very long adaptive filters. The major problem with the implementation of long adaptive filters is that they are computationally very expensive. That is, their implementation requires a very fast processor for achieving a real-time realization of the AEC.

Figure 2:
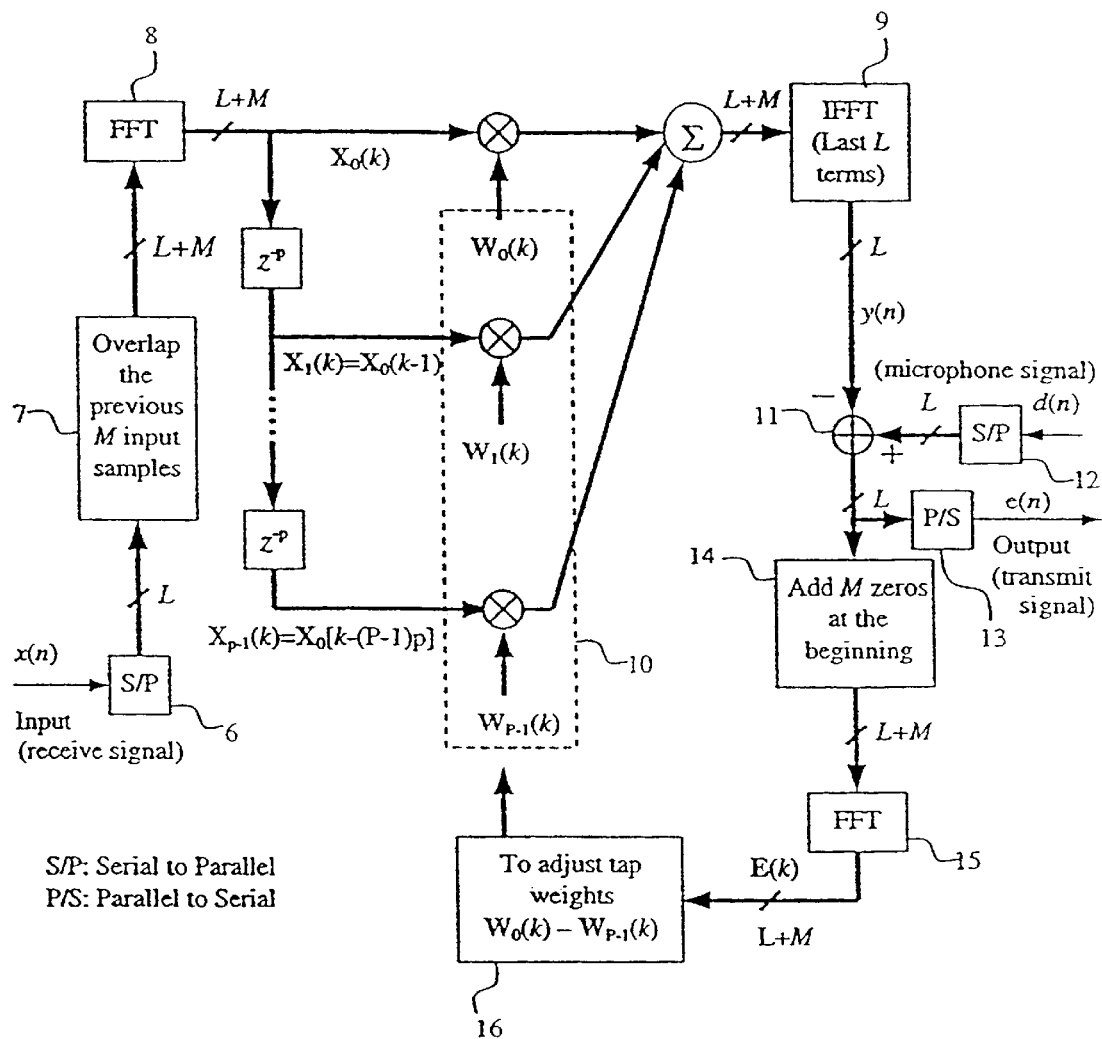
FIG. 2 depicts the general configuration of an example AEC without howling suppression and double-talk detection.
Figure 3:
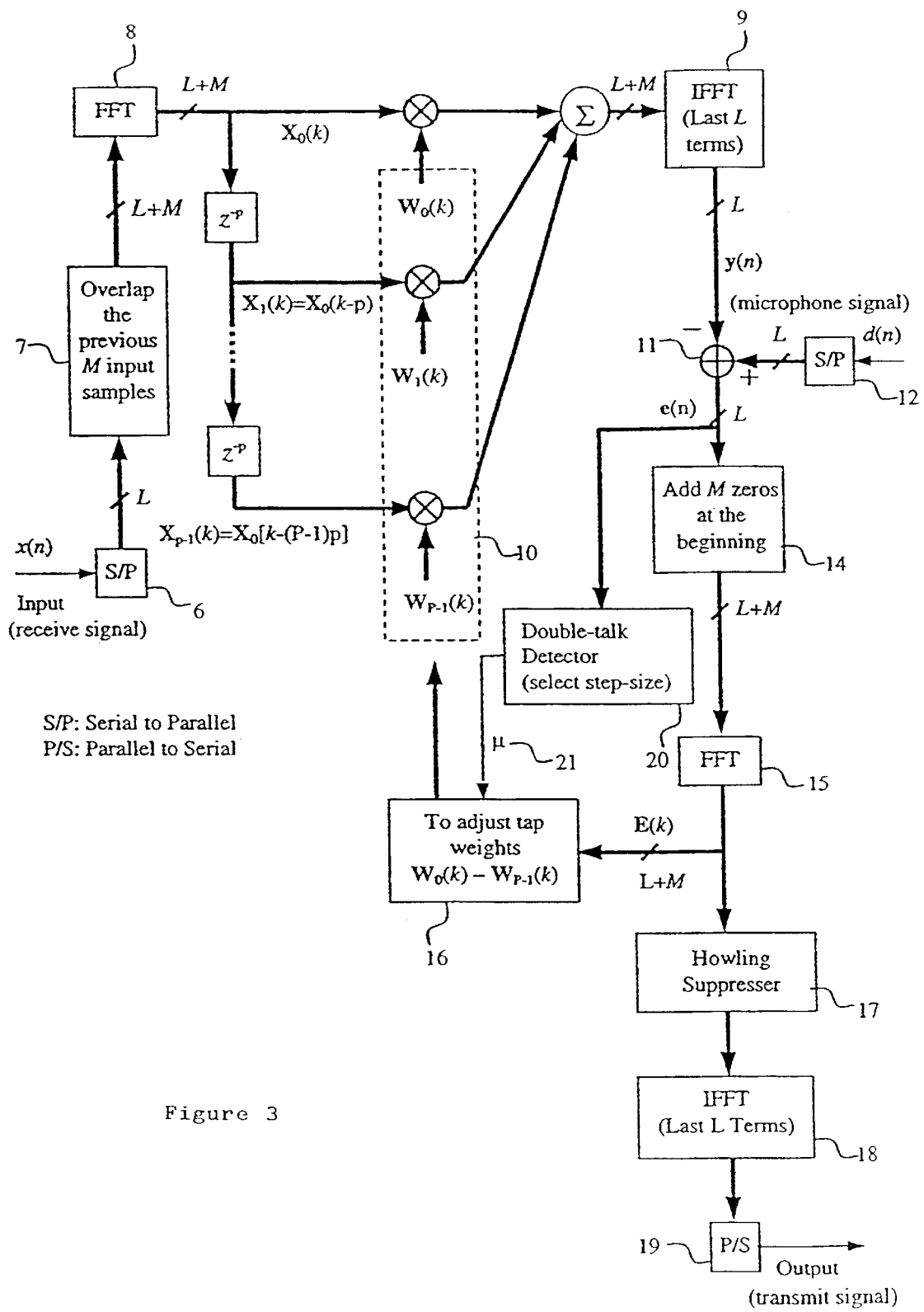
FIG. 3 depicts the general configuration of an example AEC with howling suppression and double-talk detection in accordance with a preferred embodiment of the invention.

The computational complexity of long adaptive filters can be reduced to a great extent by choosing a parallel processing strategy in the implementation of the filters. Among prior solutions proposed in the literature, realizations of filters in the frequency domain have been the most successful approach. This method uses fast Fourier transform (FFT) algorithms to achieve low computational complexity. FIG. 2 depicts the schematic diagram of a realization of the AEC using this latter technique. This block diagram includes filtering and adaptive adjustment of the filter coefficients 10. A received signal x(n) is insert to the S/P converter 6 that outputs a converted signal having block length L. The converter signal is overlapped with the previous M input samples and converted into a frequency-domain at FFT 8. The transformed samples are inspected using a least-mean square determination method and converted back from the frequency-domain to the time-domain using an inverse FFT 9. The time-domain output signals y(n) is then implemented with the microphone signal d(n) to become the actual output samples of the AEC e(n) and are transmitted to the remote site. FIG. 3 depicts a more complete block diagram of the AEC to which the howling suppressor 17, and double-talk detector 20 blocks are added. The various parts of the AEC will be discussed later.

Figure 4:
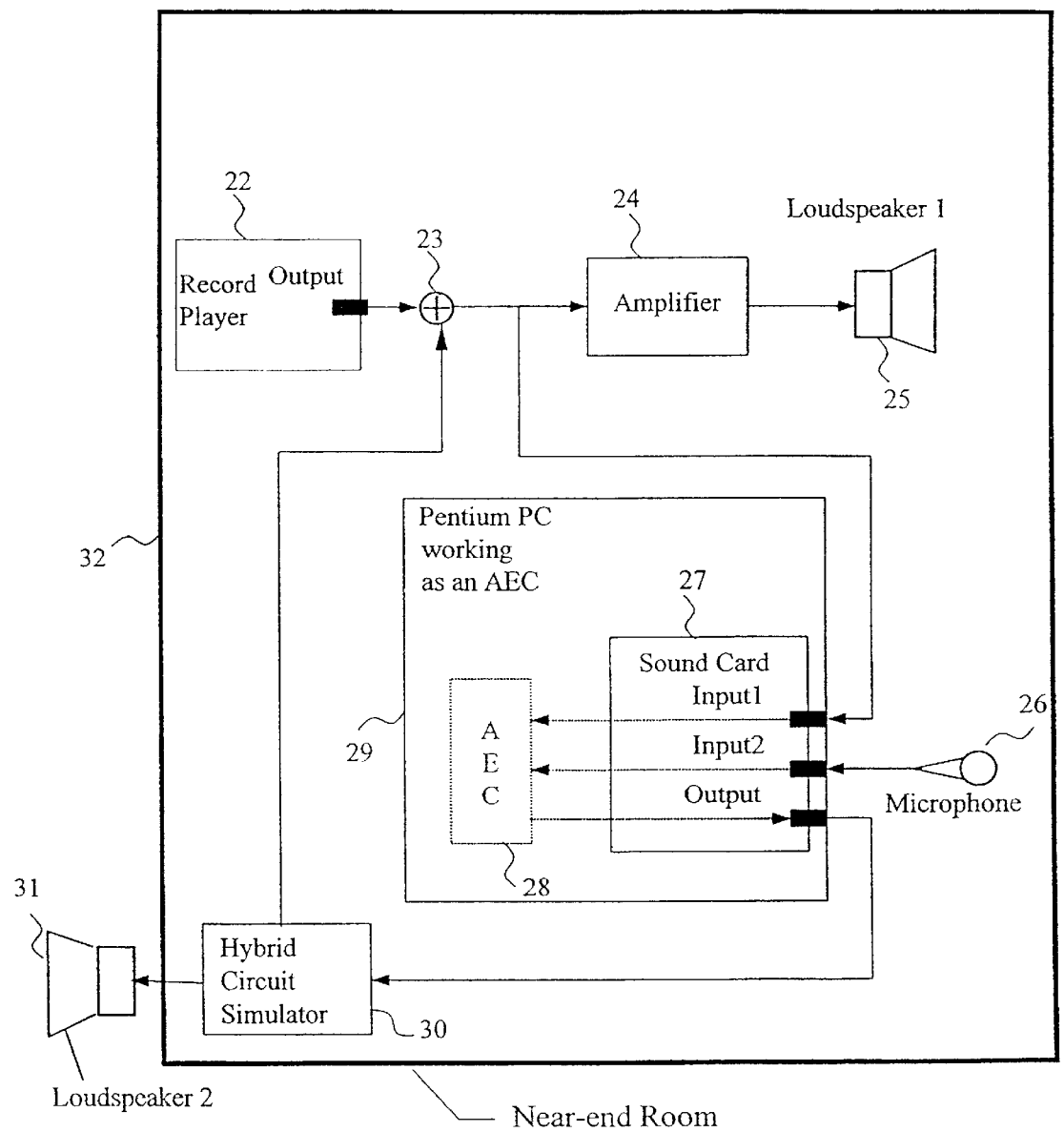
FIG. 4 depicts an example set-up embodiment used to test the AEC illustrated in FIG. 3.

FIG. 4 shows the hardware set-up which has been used to implement the AEC and test the invented schemes. A record player 22 is used to generate (simulate) the received (remote) signal. This signal is amplified by amplifier 24 and passed to a loudspeaker 25 to broadcast the received signal in the room. Any sound activity in the room is picked-up by a microphone 26. Both microphone output and the received (remote) signals are directed to a sound card 27 for digitization. The digitized sampled signals are passed to the AEC software 28 which is run on, for example, a Pentium personal computer 29, for evaluation of the AEC performance.

After processing these signals according to FIG. 3, the generated output samples (the error signal samples in FIG. 1) are delivered to the sound card 27 for digital to analog conversion. The output signal which is the transmit signal is passed to a second loudspeaker 31 (loudspeaker 2) which is put outside of the local room. The sound coming out of this second loudspeaker 31 corresponds to the received signal at the remote site of the telephone line. The effect of the hybrid circuit of the telephone line is simulated by using a special simulator circuit 30. The transmit signal generated at the output of the sound card with no attenuation is passed to the second loudspeaker 31. A filtered and attenuated version of the transmit signal is added 23 to the simulated received signal at the output of the record player 22, as the hybrid circuit leakage.

FIG. 3 shows a complete block diagram of the AEC and consists of three separate parts: the basic acoustic echo canceller (FIG. 2), the echo howling suppressor 17, and the double-talk detector 20. These three parts are discussed separately below.

The basic acoustic echo canceller is implemented by following the partitioned frequency domain LMS (PFBLMS) algorithm as proposed by the inventor in Farhang-Boroujeny, B., "Analysis and efficient implementation of partitioned block LMS adaptive filters", *IEEE Trans. Signal Processing*, vol. 44, pp. 2865–2868, November 1996. The difference between this implementation and the previously reported implementations of the PFBLMS algorithm is that in the previous implementations the block length, L, and the partition length, M, were assumed to be the same. However, the preferred embodiment of this invention disclose that L should be selected smaller than M. Although L=M reduces the convergence rate of the PFBLMS algorithm significantly, a selection of L<M results in an implementation that has lower misadjustment than where L=M when the unconstrained FBLMS algorithm is used for adaptation of the AEC coefficients. The use of an unconstrained FBLMS algorithm for the proposed AEC is found to be essential to achieve a real-time realization of the AEC, since it keeps the computational complexity of the AEC significantly lower that what would be achieved if the constrained FBLMS algorithm was to be used.

To demonstrate the efficiency of the proposed AEC technique, a program was developed and tested for a real-time implementation of the AEC. By choosing and developing appropriate FFT algorithms and C-language software, a 2112 tap adaptive echo canceller running at 8 kilo-samples/s on a Pentium personal computer was provided according to a preferred embodiment of the invention. A 2112 tape adaptive echo cancellor running at the sampling rate of 8 kilo-samples/s is equivalent to an echo coverage of 1000*(2112/8000)=264 milliseconds. This is a fairly long echo coverage. Current commercial AEC systems have a coverage of less than or equal to 200 milliseconds.

Using a Pentium 166 MHz machine, as an example platform, the echo canceller uses only about 40% of the central processing unit (CPU) run time. This example clearly demonstrates that the proposed technique is indeed a viable solution to the acoustic echo cancelling problem.

Howling is a common problem which is usually observed in audio systems. It may arise because of the presence of a potential positive feedback in the loop consisting of the loudspeaker 1, acoustical echo path in the room, the microphone 5 and the telephone line hybrid circuit 4. Once the gain around this loop becomes larger that one at any particular frequency the AEC begins to oscillate at that frequency with a growing amplitude. The system quickly makes a very loud sound which completely disrupts the communication. Furthermore, the large amplitude of the oscillating signal forces the circuit components (such as amplifiers and the loudspeakers) to their saturation region. This, in turn, results in a non-linear behavior of the circuit. This non-linear behavior of the circuit, on the other hand, disrupt the operation of the basic AEC whose design has been based on a linear behavior of the whole system. This disruption worsens the howling situation and makes it even more difficult to get out of a howling state once it starts. Thus, it is emphasized that an early detection of the howling state and proper remedies to stop the howling before it reaches an unacceptable level is very important for a successful implementation of any acoustic echo cancelling system.

Fortunately, the frequency domain implementation chosen in our embodiments allow adoption of a very effective solution to provide howling suppression. Howling usually occurs at one single frequency. Moreover, the use of FFT blocks that appear in the discussed AEC structure results in a separation of various frequency components of the underlying signals in different frequency bins. The presence of howling can then be detected easily, as it results in a consistent grow of the signal energy in one of the frequency bins—namely, the frequency bin associated with the howling frequency.

The blocks related to howling suppression are highlighted in FIG. 3. As compared to FIG. 2 which does not include the howling suppression, FIG. 3 adds one extra IFFT block 18. The output of the AEC is the error signal between the signal picked up by the microphone, d(n), and the output e(n) of the P/S converter 19. If the howling suppressor was not included, the AEC output would be the difference between d(n) and e(n), 11, 13, as shown in FIG. 2. This is very similar to the implementations proposed in the previous publications with some differences in the election of block length and partition length, i.e., the selection of L<M, as noted above. See generally, Asharif, M. R., and F. Amano, "Acoustic echo-canceller using the FBAF algorithm", *IEEE Transactions on Communications*, Vol. COM-r2, pp. 3090–3094, 1994, Soo, J. S., and K. K. Pang, "Multidelay block frequency domain adaptive filter", *IEEE Trans. Acoust. Speech and Signal Process.*, vol. ASSP-38, pp. 373–376, 1990, and McLaughlin, "System and methods for an efficiently constrained frequency-domain adaptive filter", U.S. Pat. No. 5,526,426 (June 1996).

Figure 5:
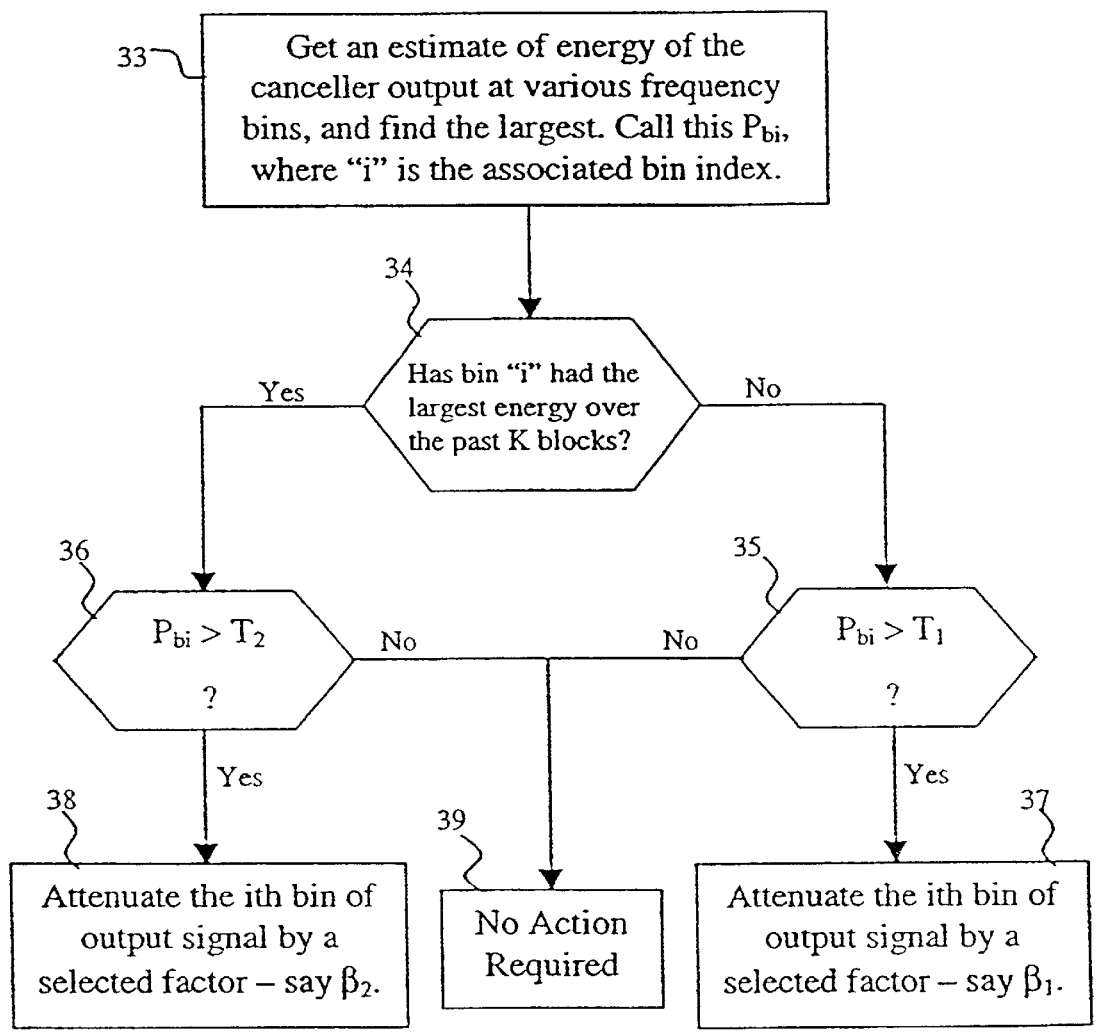
FIG. 5 presents a howling suppression procedure in accordance with a preferred embodiment of the invention.

FIG. 5 shows an example procedure proposed in this embodiment of the invention for howling suppression. The energies of various frequency bins of the transmit (error) signal after processing every block of signals samples are estimated and the frequency bin with the largest energy is identified 33 as $P_{bi}$. If $P_{bi}$ is found to have a relatively large energy, say, greater than a threshold level $T_1$, it is assumed that howling has occurred at this frequency (bin) 35. The transmit signal at this frequency bin is then attenuated by a prescribed factor, say $\beta_1$ 37. The conversion of the frequency domain samples to time-domain is then performed using an inverse FFT (IFFT) 18. The time domain samples generated in this way are the output (transmit signal) samples. If the bin with the largest energy is not excessive, but has remained as the bin with the largest energy over a prescribed number of blocks, say K 34, and its present energy estimate exceeds a prescribed level, say $T_2$, it is assumed that howling has occurred at that frequency (bin) 36. The transmit signal at this frequency bin is then attenuated by a prescribed factor, say $\beta_2$ 38. Then, conversion of the frequency domain samples to time-domain is executed at IFFT 18. The time domain samples are the P/S 19 output (transmit signal) samples.

Actual implementation of the howling suppression scheme has shown that it is robust to the selection of the threshold level $T_1$ and $T_2$ and also to the attenuating factors $\beta_1$ and $\beta_2$. As a general guideline, a value of $T_1$ about two to three times the largest signal energy bins in the absence of howling and a value of $T_2$ about two-third of $T_1$ was determined to work well. Typical values that are suggested for $\beta_1$ and $\beta_2$ are about 0.25 and 0.5, respectively. These also have been determined through numerous experimental tests.

The howling suppression mechanism discussed above was included in the implemented AEC system and tested under fairly harsh (difficult to handle) conditions. It was generally observed that the suppression worked very well under all conditions. The experiments were performed in a 3-by-5 meter room and contained hard furniture (wooden desks, almost empty bookshelves, and computers), uncarpeted floor, and hard walls and ceiling. The acoustical echo path measured in the room was about 200 milliseconds. People moved in the room during the tests to change the echo paths. Also, the microphone 26 and loudspeaker 25 were moved and placed in different directions while the AEC was operating. The microphone 26 was also moved to face the loudspeaker 25—this, of course, corresponds to the maximum loop gain and is the best case for forcing the system into a howling state. Further, the hybrid circuit simulator 30 attenuation was adjusted to a fairly low level of −6 dB. Despite these very harsh conditions, in all cases the howling suppression mechanism acted quickly and prevented the howling in the system.

The howling suppression scheme also works when howling occurs at more than one frequency, even though the scheme suppresses only one frequency bin at a time. If howling occurs at more than one frequency, the embodied mechanism suppresses one of them at any given time. Because of its extremely fast reaction, the mechanism easily reacts to the howling in other frequency bins and suppresses them before they grow to an uncontrollable state, that is, before their corresponding amplitudes become so large that the AEC enters into a non-linear state. Although, simultaneous attenuation of multiple frequency bins is also possible, attenuating one frequency bin at a time sufficiently works well. Thus, attenuation of multiple frequency bins is not very critical. However, if attenuation of multiple frequency bins is necessary, inclusion of this modification to the howling suppressor is straightforward. For instance, one can attenuate all frequency bins having associated energies greater than $T_1$.

Therefore, this invention solves the problem of howling. It is a special solution compatible within the structure of the PFBLMS algorithm. However, the invention is not limited to the PFBLMS algorithm. Other implementations may also adopt the invented technique. For example, one can use an FFT 15 to convert the output samples to a frequency domain, inspect the transformed samples in the frequency domain, examine various frequency bins as discussed above, perform attenuation of any of the frequency bins by the howling suppressor 17, if necessary, and convert back the output signal samples from the frequency-domain back to time-domain using an inverse FFT (IFFT) 18. These samples will then be the actual output samples of the howling suppressor.

Double-talk detection is an important and necessary block for successful operation of any AEC system. The previous proposals suggest the use of power estimators at the receive and transmit signal sides and comparisons for detecting the double-talk state. See generally, Miyamoto et al, "Double-talk detection in an echo canceller", U.S. Pat. No. 4,894,820. Furukawa et al (U.S. Pat. No. 5,463,618) discussed some difficulties which exist with the scheme disclosed in Miyamoto et al (U.S. Pat. No. 4,894,820) and proposed an improved method. The Furukawa et al method, however, is expensive to implement, since it requires a second adaptive filter run at a decimated rate in parallel with the original adaptive filter. The present application discloses a simpler and more effective solution to the problem of double talk.

A common problem to the methods of Kiyamoto et al and Furukawa et al is that both of them suspend the adaptation of the adaptive filter of the AEC once a double-talk state is recognized. This is a problem, since sometimes the echo response changes when double-talk exists. An embodiment of this invention provides a better way of handling the double-talk states by reducing the step-size of the adaptive filter of the AEC. This enables both low level misadjustment of the adaptive filter and tracking of echo path variations during double-talk periods.

Figure 6:
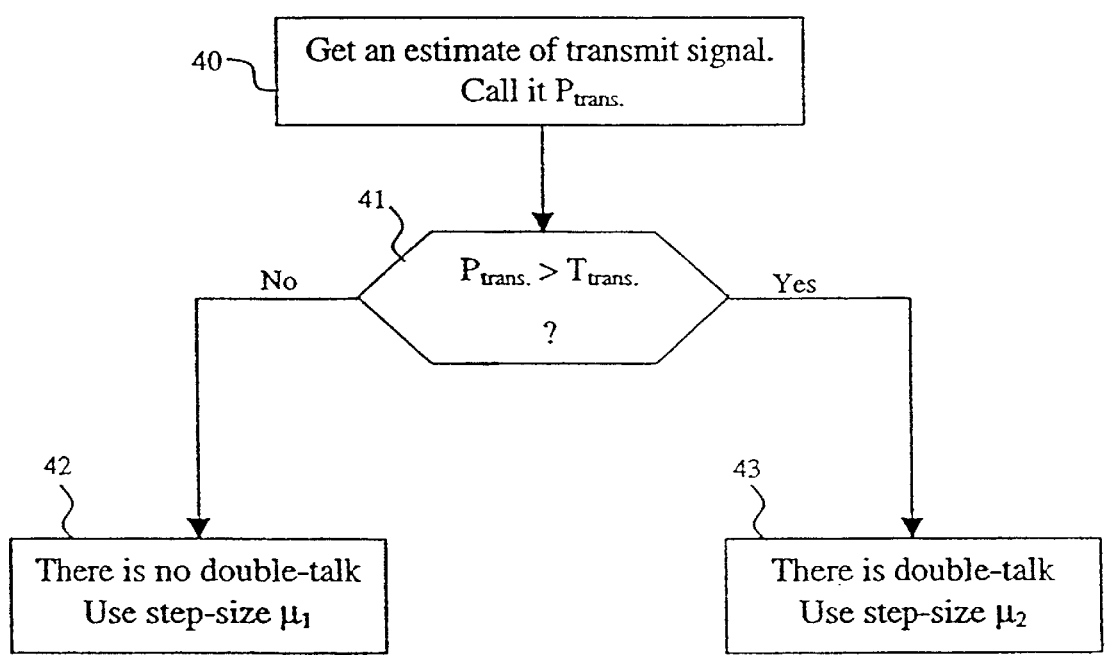
FIG. 6 presents double-talk detection procedure and its application in controlling the adaptation algorithm step-size in accordance with a preferred embodiment of the invention.

FIG. 6 shows an example procedure that this embodiment discloses for resolving the problem of double-talk. The output power of the AEC, i.e., the power of the transmit signal, is estimated by a short-time averaging of the squared values of the signal samples. The estimated power 40, called $P_{trans.}$ is compared with a threshold level, $T_{trans.}$. If the estimated power, $P_{trans.}$, is smaller than $T_{trans.}$ 41, it is assumed that the AEC is not in the double-talk state and, thus, the algorithm step-size, $\mu$ 21, is set equal to $\mu_1$ 42, which is a relatively large step-size. If the estimated power is larger than $T_{trans.}$ 41, it is assumed that the AEC is in the double-talk state and, thus, the algorithm step-size, $\mu$ 21, is set equal to $\mu_2$ 43, which is a relatively small step-size.

Since the double-talk detector works based on an estimate of the transmit signal power, it may wrongly assume a double-talk state when the adaptive filter part of the AEC has not converged and the reflected echo at the transmit line is excessively large. This situation occurs when the AEC is initialized, i.e., at the beginning of communication when the AEC circuit begins to identify the acoustical echoes of the room. This results in a selection of a small step-size ($\mu_2$), and slow convergence of the AEC at the beginning execution stages. This clearly is undesirable. Fortunately, the problem can easily be alleviated by leaving the step-size of the AEC at the larger value of $\mu_1$ for the initial seconds of communication and then injecting a white noise signal to the loudspeaker 1 and the adaptive filter 2 (during that period) so that the adaptive filter 2 will be sufficiently exited and converge fast. The AEC can later be switched to its normal mode of double-talk detection.

Unlike the method of Furukawa et al (U.S. Pat. No. 5,463,618), the proposed double-talk detector does not need an additional secondary adaptive filter. Thus, it is much simpler to implement. Despite its simplicity practical tests have shown that it works very well. This technique is much simpler than the previously reported methods and still results in very good performance.

It should be apparent from the aforementioned description and attached drawings that the concept of the present application may be readily applied to a variety of preferred embodiments including those disclosed herein. Accordingly, the scope of the invention described in the instant application should be limited solely by the appended claims.

What is claimed is:

1. A method for cancelling acoustic echo, comprising:
   receiving an signal in a time-domain having a block length smaller than a partition length;
   converting the received signal from the time-domain to a frequency-domain signal in a frequency-domain;
   filtering the frequency-domain signal into partitioned sections;
   converging the frequency-domain signal into an aggregate sum of the partitioned sections;
   converting the frequency-domain signal in the frequency-domain to an output signal in the time-domain; and
   transmitting the output signal to a remote location.

2. The method of claim 1, further comprising:
   separating the frequency-domain signal into frequency components located in a plurality of frequency bins;
   identifying one of the plurality of frequency bins having a largest signal energy; and
   attenuating a frequency components of the frequency-domain signal located at the one of the plurality of frequency bins by a first factor when a largest signal energy exceeds the first threshold level.

3. The method of claim 2, wherein the first threshold level is at least about 2 times a value of an estimated largest signal energy bin in the absence of howling.

4. The method of claim 2, wherein the first factor is about 0.25.

5. The method of claim 2, further comprising attenuating the frequency components of the frequency-domain signal located at the one of the plurality of frequency bins by a second factor when the largest signal energy exceeds a second threshold level.

6. The method of claim 5, wherein the first threshold level is at least about 2 times a value of an estimated largest signal energy bin in the absence of howling and the second threshold level is about two-thirds of the first threshold level.

7. The method of claim 5, wherein the first factor is about 0.25 and the second factor is about 0.5.

8. The method of claim 1, further comprising:
   converting the output signal from the time-domain to a transformed output signal in a frequency-domain;
   separating the transformed signal into frequency components located in a plurality of frequency bins;
   identifying one of the plurality of frequency bins having a largest signal energy;
   attenuating the frequency components of the transformed signal located at the one of the plurality of frequency bins when the largest signal energy exceeds a threshold level; and
   converting the transformed signal from the frequency-domain to a retransformed output signal in the time-domain.

9. The method of claim 1, further comprising:
   estimating a power level of the output signal by a short-time averaging of a squared value of the partitioned sections of the frequency-domain signal;
   comparing the power level to an echo threshold level;
   setting an algorithm step-size to a first step size when the power level falls below the echo threshold level; and
   setting the algorithm step-size to a second step size when the power level exceeds the echo threshold level, wherein the second step size is smaller than the first step size.

10. The method of claim 9, further comprising setting the algorithm to the first step size for an initial term of communication with a remote site.

11. An acoustic echo cancellation device, comprising:
    input means for receiving a signal in a time-domain having a block length smaller than a partition length;
    transformer means for converting a received signal from the time-domain to a frequency-domain signal in the frequency-domain;
    partition means for filtering the frequency-domain signal into partitioned sections;
    summation means for converging the frequency-domain signal into an aggregate sum of the partitioned sections;
    inverse transformer means for converting the frequency-domain signal in the frequency-domain to an output signal in the time-domain; and
    output means for transmitting the output signal to a remote location.

12. The acoustic echo cancellation device of claim 11, further comprising:
    isolation means for separating the frequency-domain signal into frequency components located in a plurality of frequency bins;
    determination means for identifying one of the plurality of frequency bins having a largest signal energy; and
    first adjustment means for attenuating a frequency components of the frequency-domain signal located at the one of the plurality of frequency bins by a first factor when a largest signal energy exceeds the first threshold level.

13. The acoustic echo cancellation device of claim 12, wherein the first threshold level is at least about 2 times a value of an estimated largest signal energy bin in the absence of howling.

14. The acoustic echo cancellation device of claim 12, wherein the first factor is about 0.25.

15. The acoustic echo cancellation device of claim 12, further comprising second adjustment means for attenuating the frequency components of the frequency-domain signal located at the one of the plurality of frequency bins by a second factor when the largest signal energy exceeds a second threshold level and remain to be the bin with the largest energy over a prescribed number of blocks.

16. The acoustic echo cancellation device of claim 15, wherein the first threshold level is at least about 2 times a value of an estimated largest signal energy bin in the absence of howling and the second threshold level is about two-thirds of the first threshold level.

17. The acoustic echo cancellation device of claim 15, wherein the first factor is about 0.25 and the second factor is about 0.5.

18. The acoustic echo cancellation device of claim 11, further comprising:
    additional transformer means for converting the output signal from the time-domain to a transformed output signal in the frequency-domain;
    isolation means for separating the transformed signal into frequency components located in a plurality of frequency bins;
    determination means for identifying one of the plurality of frequency bins having a largest signal energy;
    adjustment means for attenuating the frequency components of the transformed signal located at the one of the plurality of frequency bins when the largest signal energy exceeds a threshold level; and
    additional inverse transformer means for converting the transformed signal from the frequency-domain to a retransformed output signal in the time-domain.

19. The acoustic echo cancellation device of claim 11, further comprising:
   appraisal means for estimating a power level of the output signal by a short-time averaging of a squared value of the partitioned sections of the frequency-domain signal;
   relation means for comparing the power level to an echo threshold level; and
   response means for setting an algorithm step-size to a first step size when the power level falls below the echo threshold level, and for setting the algorithm step-size to a second step size when the power level exceeds the echo threshold level, wherein the second step size is smaller than the first step size.

20. The acoustic echo cancellation device of claim 19, further comprising initialization means for setting the algorithm to the first step size for an initial term of communication with a remote site.

* * * * *